United States Patent
Lim et al.

(10) Patent No.: US 8,319,423 B2
(45) Date of Patent: Nov. 27, 2012

(54) DISPLAY DEVICE WITH PROTECTING LAYER FOR GETTER LAYER

(75) Inventors: Kwang Su Lim, Busan (KR); Jung Hwan Lee, Daegu (KR)

(73) Assignee: LG Display Co., Ltd., Seoul (KR)

( * ) Notice: Subject to any disclaimer, the term of this patent is extended or adjusted under 35 U.S.C. 154(b) by 142 days.

(21) Appl. No.: 11/637,775

(22) Filed: Dec. 13, 2006

(65) Prior Publication Data

US 2008/0093990 A1    Apr. 24, 2008

(30) Foreign Application Priority Data

Oct. 24, 2006   (KR) .................... 10-2006-0103658

(51) Int. Cl.
*H01J 1/62* (2006.01)
*H01J 63/04* (2006.01)

(52) U.S. Cl. ........ 313/506; 313/498; 313/512; 313/553; 313/558

(58) Field of Classification Search .......... 313/498–512, 313/553, 558
See application file for complete search history.

(56) References Cited

U.S. PATENT DOCUMENTS

| | | | |
|---|---|---|---|
| 4,806,576 A | 2/1989 | Woodson | |
| 6,551,724 B2 * | 4/2003 | Ishii et al. | 428/690 |
| 6,788,003 B2 | 9/2004 | Inukai et al. | |
| 6,887,592 B2 * | 5/2005 | Hieda et al. | 428/690 |
| 7,355,204 B2 * | 4/2008 | Coe | 257/72 |
| 2001/0028218 A1 * | 10/2001 | Mashiko et al. | 313/553 |
| 2002/0101156 A1 * | 8/2002 | Park et al. | 313/512 |
| 2002/0155320 A1 * | 10/2002 | Park et al. | 428/690 |
| 2003/0198830 A1 * | 10/2003 | Kim et al. | 428/690 |
| 2004/0012332 A1 | 1/2004 | Sasatani et al. | |
| 2004/0189195 A1 * | 9/2004 | Allemand | 313/512 |
| 2004/0201347 A1 * | 10/2004 | Park et al. | 313/512 |
| 2005/0168143 A1 | 8/2005 | Kum et al. | |
| 2005/0241483 A1 * | 11/2005 | Okada et al. | 96/134 |
| 2006/0003139 A1 * | 1/2006 | Choi et al. | 428/76 |
| 2006/0158077 A1 * | 7/2006 | Yokoyama et al. | 313/112 |
| 2006/0170341 A1 | 8/2006 | Su et al. | 313/512 |
| 2006/0214569 A1 * | 9/2006 | Ohshita et al. | 313/504 |

(Continued)

FOREIGN PATENT DOCUMENTS

EP    0 969 700 A1    1/2000

(Continued)

OTHER PUBLICATIONS

Japanese Office Action dated May 24, 2011.

*Primary Examiner* — Anh Mai
*Assistant Examiner* — Kevin Quarterman
(74) *Attorney, Agent, or Firm* — Morgan, Lewis & Bockius LLP

(57) ABSTRACT

The present invention relates to a display device preventing a getter layer from contacting elements disposed in the display device, and an embodiment of the present invention may be achieved in a whole or in part by a display device comprising: A substrate; A pixel part disposed on the substrate; A cap comprising a first region attached on the substrate; and a second region having a position different from a position of the first region, connected with the first region, and corresponding to the pixel part; A getter layer disposed on the second region of the cap; and A protecting layer disposed on the getter layer.

17 Claims, 9 Drawing Sheets

U.S. PATENT DOCUMENTS

2006/0284556 A1 * 12/2006 Tremel et al. ................. 313/512

FOREIGN PATENT DOCUMENTS

| | | | |
|---|---|---|---|
| JP | 10-275682 | A | 10/1998 |
| JP | 11-329719 | A | 11/1999 |
| JP | 2001-267065 | A | 9/2001 |
| JP | 2002-280166 | A | 9/2002 |
| JP | 2002-305076 | A | 10/2002 |
| JP | 2003-317936 | A | 11/2003 |
| JP | 2004-319450 | A | 11/2004 |

* cited by examiner

DISPLAY DEVICE WITH PROTECTING LAYER FOR GETTER LAYER

CROSS-REFERENCE TO RELATED APPLICATIONS

This application claims priority from Korean Patent Application No. 10-2006-0103658 filed on Oct. 24, 2006, the content of which is incorporated herein by reference in its entirety.

BACKGROUND

1. Field

The present invention relates to a display device preventing a getter layer from contacting elements disposed in the display device.

2. Background

FIG. 1 is a simplified cross-sectional view of an organic light-emitting device of the related art.

As shown in FIG. 1, the organic light-emitting device, one of the display devices, comprises a pixel part disposed on a substrate 1. An anode electrode 2 and a cathode electrode 4, included in the pixel part, are connected with a data line and a scan line, disposed on the outside of the pixel part, respectively. Ends of the data line and the scan line are disposed on at least one edge of the substrate 1, and form a pad part.

And then, the pixel part, the data lines and the scan lines are isolated from the outside by a cap attached to the substrate 1 using a sealant.

Each element included in the organic light-emitting device, particularly an organic light-emitting layer 3 disposed on the anode electrode 2 may be damaged by high temperature and moisture, and thus a cap is attached to the substrate 1 in order to protect the elements of the organic light-emitting device from the outer environment.

However, it is difficult to perfectly prevent moisture and oxygen existing in the outer environment from being transmitted to an inner space of the organic light-emitting device (i.e. a space between the cap and the substrate 1) through microscopic gaps between the cap and the substrate 1 to which the cap is attached.

In order to remove the moisture or the oxygen transmitted to the inner space of the organic light-emitting device, the getter layer is attached to an inner surface of the cap.

The getter layer, composed of chemical materials, absorbs the moisture by chemical reactions with the moisture, whereby the moisture existing in the inner space between the cap and the substrate 1 is removed. Such an absorbing function of the getter layer prevents each element of the organic light-emitting device from being damaged by the moisture.

External force such as vibration, impact, etc., may be exerted on the cap of the organic light-emitting device during many quality tests. In case the external force is exerted on the cap having a thin thickness, the cap is pressed toward the substrate 1.

Also, in order to enlarge a size of the organic light-emitting device, a size of the cap should be increased, and the cap having a thin thickness and a large size experiences deflection by its weight.

Therefore, the getter layer attached to the inner surface of the cap may contact the cathode electrode 4 of the pixel part by deflection induced by the external force or the weight of the cap.

Chemical reaction occurs at a contact area between the getter layer composed of chemical materials and the cathode electrode 4 composed of metal. High chemical activity of the getter layer accelerates the chemical reaction, whereby the cathode electrode 4 is damaged, and even peeled from the substrate 1. The damage of the cathode electrode 4 and the peeling of the cathode electrode 4 have a bad influence on the function of the organic light-emitting device.

In case the cathode electrode 4 composed of metal is peeled, metallic particles are separated from the cathode electrode 4. Such metallic particles are located between the cathode electrodes 4, whereby the cathode electrodes 4 may be shorted by the metallic particles.

Such a problem occurs during transportation, manipulation, and use of the display device as well as during the quality test of the display device.

BRIEF DESCRIPTION OF THE DRAWINGS

The embodiments will be described in detail with reference to the following drawings in which like reference numerals refer to like elements.

FIG. 5b is a cross-sectional view of an organic light-emitting device according to a second embodiment of the present invention, corresponding to FIG. 5a.

FIG. 5c is a cross-sectional view of an organic light-emitting device according to a third embodiment of the present invention, corresponding to FIG. 5a.

FIG. 5d is a cross-sectional view of an organic light-emitting device according to a fourth embodiment of the present invention, corresponding to FIG. 5a.

DETAILED DESCRIPTION OF THE INVENTION

An object of a present invention is to provide a display device for preventing a getter layer from contacting a pixel part.

Hereinafter, the display devices according to the embodiments of the present invention will be explained in more detail with reference to the accompanying drawings. Also, organic light-emitting devices will be explained for explanation purposes. However, the present invention is not limited to the organic light-emitting devices.

Figure 1:
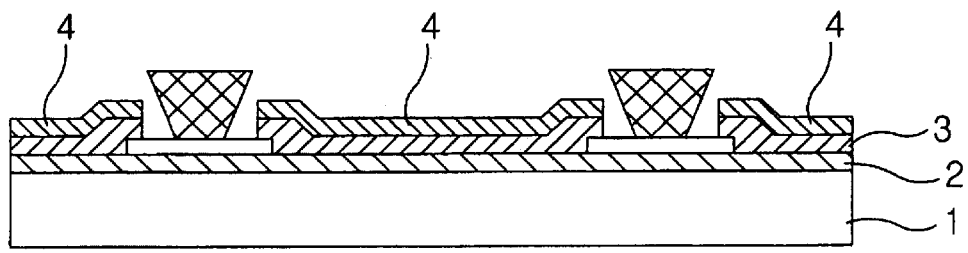
FIG. 1 is a simplified cross-sectional view of an organic light-emitting device of the related art.
Figure 2:
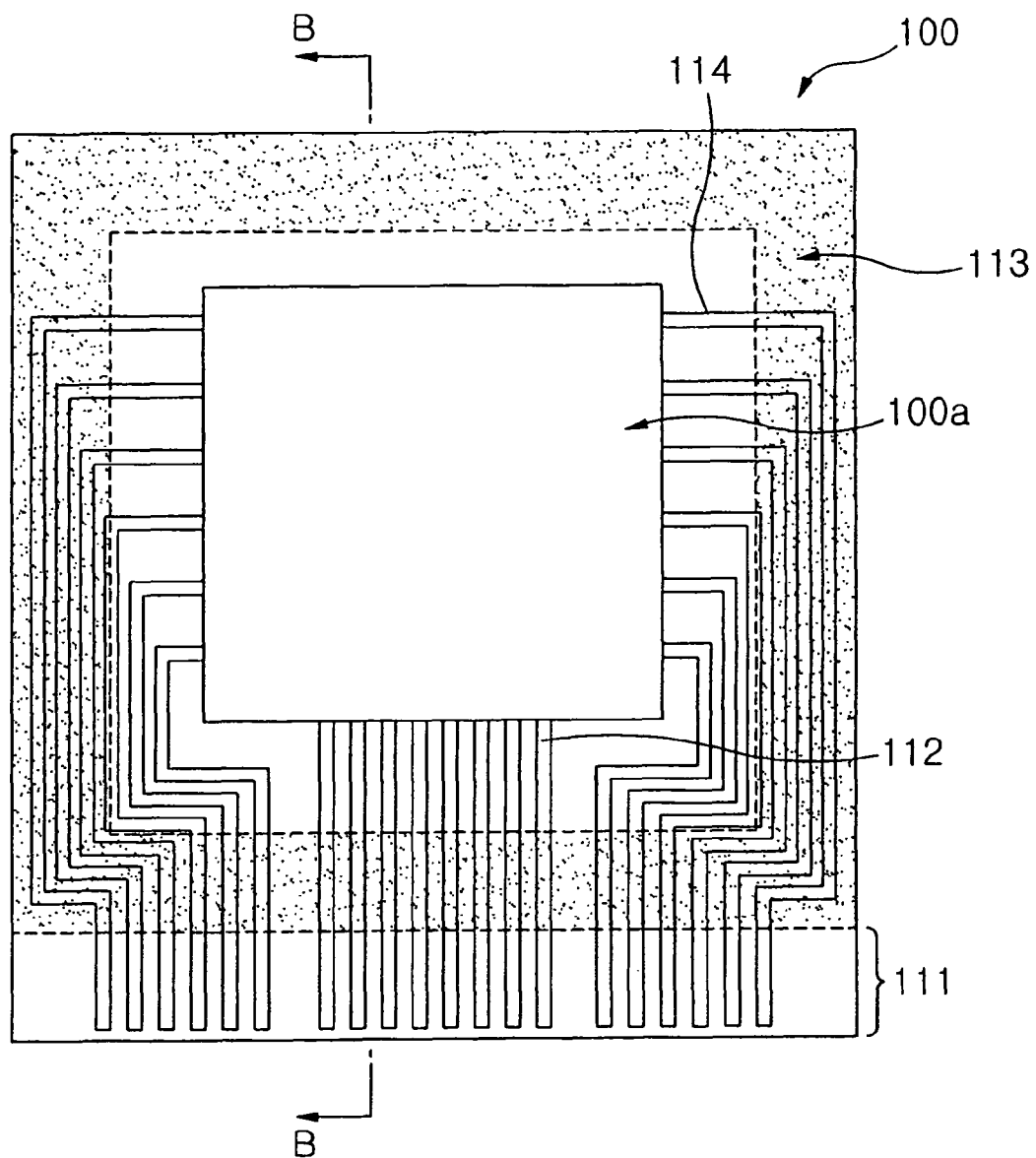
FIG. 2 is a plane view of an organic light-emitting device according to a first embodiment of a present invention.

FIG. 2 is a plane view of an organic light-emitting device according to a first embodiment of the present invention, and shows the organic light-emitting device to which a cap is not attached.

Figure 3:
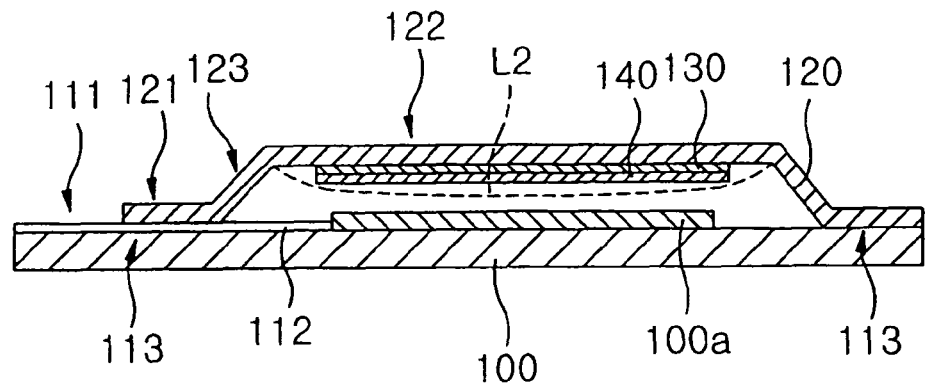
FIG. 3 is a cross-sectional view of the organic light-emitting device according to the first embodiment of the present invention taken along the line B-B of FIG. 2.

FIG. 3 is a cross-sectional view of the organic light-emitting device according to the first embodiment of the present invention taken along the line B-B of FIG. 2. The organic light-emitting device according to the first embodiment of the present invention comprises a pixel part 100a having an anode electrode, an organic light-emitting layer disposed on the anode electrode, and a cathode electrode disposed on the organic light-emitting layer. The anode electrode and the cathode electrode are connected with a data line 112 and a scan line 114 respectively, which are disposed on the outside of the pixel part 100a.

Ends of the data line 112 and the scan line 114 are disposed on at least an edge of the substrate 100, forming a pad part 111, or are connected with a device driver without the pad part 111.

After the pixel part 100a, the data line 112 and the scan line 114 are formed on the substrate 100, they are isolated from the outside by the cap 120 attached to the substrate 100 using a sealant. A cap-attaching area 113 is defined as an outer region of the pixel part 100a, disposed on the substrate 100, to which the cap 120 is attached.

The cap 120 of the organic light-emitting device according to the first embodiment of the present invention comprises a first region 121 which is attached to the cap-attaching area 113 of the substrate 100 by a sealant; a second region 122 disposed on a plane different from a plane of the first region 121, the second region 122 corresponding to the pixel part 100a disposed on the substrate 100; and a connecting region 123 connecting the first region 121 with the second region 122.

FIG. 3 shows that the second region 122 corresponding to the pixel part 100a is composed of a plane member, but a shape of the cap 120 is not limited to the shape shown in FIG. 3. For example, the second region 122 may be composed of a plurality of plane parts having different heights from the pixel part 100a.

In the cap 120 of the organic light-emitting device according to the first embodiment of the present invention, a protecting layer 140 is disposed on a predetermined area of the getter layer 130 which is attached to an inner surface of the second region 122 corresponding to the pixel part 100a.

Also, although FIG. 3 shows that the getter layer 130 is disposed on the second region 122, the getter layer 130 can be disposed on any area except for the first region 121.

The protecting layer 140 prevents the getter layer 130 from contacting the cathode electrode disposed on the pixel part 100a. A detailed shape of the protecting layer 140 will be explained referring to FIG. 4.

Figure 4:
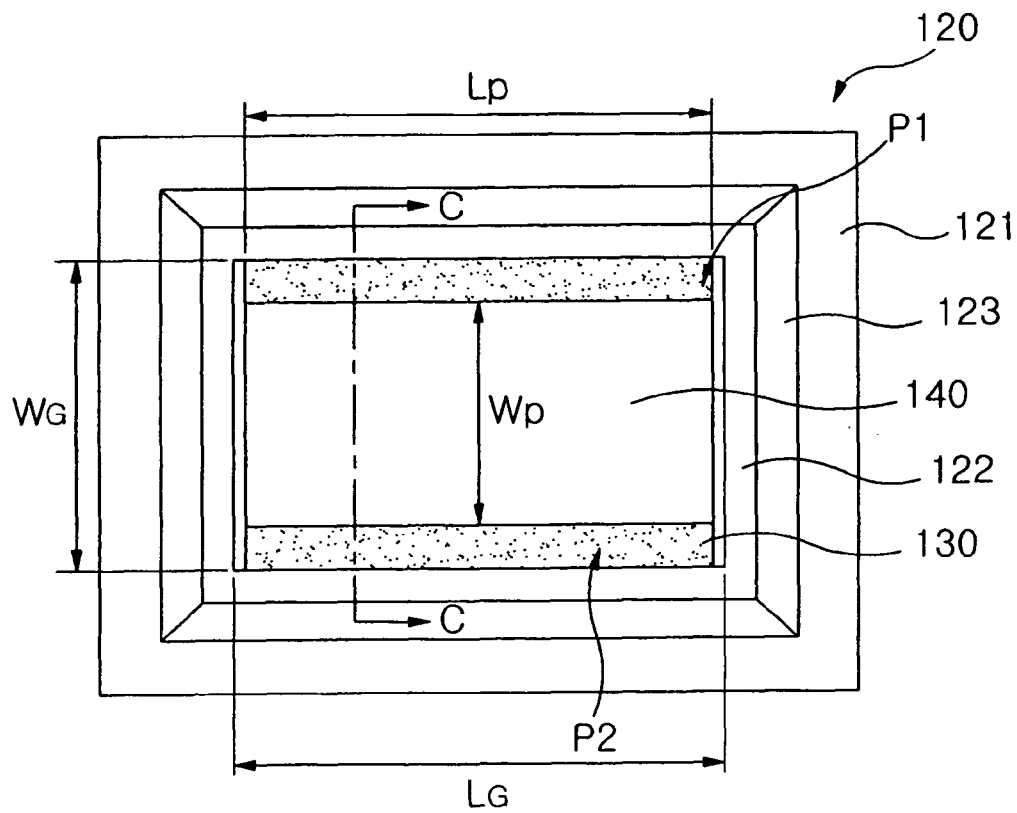
FIG. 4 is a plane view showing a bottom of the cap of the organic light-emitting device according to the first embodiment of the present invention

FIG. 4 is a plane view showing a bottom of the cap of the organic light-emitting device according to the first embodiment of the present invention, and shows a location of the protecting layer 140 relative to the getter layer 130.

Figure 5A:
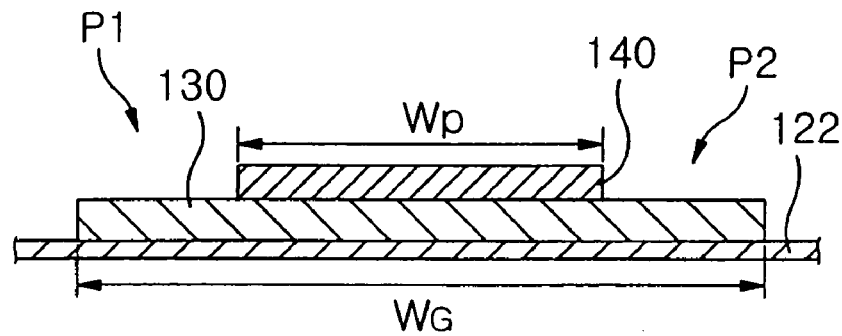
FIG. 5a is a cross-sectional view of the organic light-emitting device according to the first embodiment of the present invention taken along the line C-C of FIG. 4.

FIG. 5a is a cross-sectional view of the organic light-emitting device according to the first embodiment of the present invention taken along the line C-C of FIG. 4.

In the present specification, a horizontal length $L_P$ of the protecting layer 140 and a horizontal length $L_G$ of the getter layer 130 are defined as "length." Also, a vertical length $W_P$ of the protecting layer 140 and a vertical length $W_G$ of the getter layer 130 are defined as "width."

As explained above, the getter layer 130 is attached to the inner surface of the second region 122 of the cap 120, and the protecting layer 140 is attached to the predetermined region of the getter layer 130.

In the first embodiment of the present invention, the length $L_P$ of the protecting layer 140 is the same as the length $L_G$ of the getter layer 130, and the width $W_P$ of the protecting layer 140 is shorter than the width $W_G$ of the getter layer 130.

Therefore, as shown in FIG. 4, the protecting layer 140 does not cover predetermined areas P1 and P2 of the getter layer.

The width $W_P$ of the protecting layer 140 is determined to the extent that the absorbing function of the getter layer 130 is not affected. A width ratio $W_G:W_P$ between the width $W_G$ of the getter layer 130 and the width $W_P$ of the protecting layer 140 can be in the range between 10:1 and 2:1. The detailed reason for this range will be explained below.

If the width ratio $W_G:W_P$ is more than 10:1, the area of the protecting layer 140 is too small to effectively prevent the getter layer 130 from contacting the pixel part 100a.

Also, if the width ratio $W_G:W_P$ is less than 2:1, the area of the protecting layer 140 is too large to effectively absorb moisture because the protecting layer 140 covers almost the whole area of the getter layer 130. However, even in this width ration, if the protecting layer 140 is thin enough, the getter layer 130 can effectively absorb moisture through the protecting layer 140. If the protecting layer 140 is made from a water-permeable material, the getter layer 130 can also effectively absorb the moisture through the protecting layer 140.

Hereinafter, the function of the protecting layer 140 attached to the getter layer 130 will be explained referring to FIGS. 3 and 4.

In case the external force, such as vibration, impact, etc., or the weight of the cap 120 itself is exerted on the cap 120 with a thin thickness during some quality test or manipulation, the cap 120, particularly the second region 122, which is relatively large, is pressed toward the substrate 100 such as a dotted line L2 in FIG. 3.

However, even though the second region 122 of the cap 120 is pressed or sagged, the getter layer 130 does not contact the cathode electrode of the pixel part 100a because of the protecting layer 140 attached to the surface of the getter layer 130.

The cathode electrode is not damaged because the protecting layer 140 prevents the getter layer 130 composed of chemical materials from directly contacting the cathode electrode composed of metal. In case the cathode electrode and the protecting layer 140 are contacted directly, the cathode electrodes are not shorted between each other since the protecting layer 140 is made from an insulating material. Also, because a roughness value and a toughness value of the protecting layer 140 are lower than that of metal, the contacted cathode electrode is not damaged.

Although the protecting layer 140 is attached to the getter layer 130, the predetermined areas P1 and P2 of the getter layer 130 are exposed, whereby the getter layer 130 can absorb the moisture transmitted through the cap-attaching area 113 and the moisture contained in the sealant. Also, as explained above, in case the protecting layer 140 made from the insulating material is thin or water-permeable, the moisture existing in the inside of the organic light-emitting device can be effectively absorbed by the getter layer 130 through the protecting layer 140.

The protecting layer 140 can be made from epoxy base material having an electrical insulation characteristic and a water permeability characteristic, or made from polyimide for the function of the protecting layer 140 explained above, such as preventing the getter layer 130 from contacting the cathode electrode disposed in the pixel part 100a, preventing the cathode electrodes from being shorted, and maintaining the moisture absorption function of the getter layer 130.

For example, the above epoxy-based material can be a mixture of TMPTA (trimethylolpropane triacrylate), which is functional monomer, and epoxy acrylate; 1,4-BDGEDA (butanediol diglycidyl ether diacrylate); polybutadien; polybutadien acrylate; or PEGDA (polyethylene glycol diacrylate), but is not limited thereto.

Figure 5B:
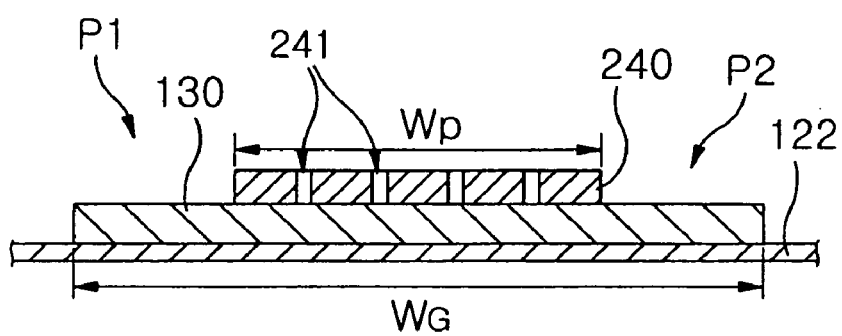

FIG. 5b is a cross-sectional view of an organic light-emitting device according to a second embodiment of the present invention, corresponding to FIG. 5a. As explained above, in case a protecting layer 240 composed of a water-permeable material comprises at least one aperture 241 passing through the protecting layer 240, the water absorption function of the getter layer 130 is advanced because moisture can be transmitted to the getter layer 130 directly through the aperture 241.

Even in case the protecting layer 240 is not composed of the water-permeable material, the moisture can be transmitted to the getter layer 130 directly through the aperture 241, whereby the getter layer 130 can absorb moisture effectively.

The area and the thickness of the protecting layer 140 or 240 can be variously determined according to the size of the organic light-emitting device. The thickness of the protecting layer 140 or 240 can be determined to the extent that a predetermined distance between the getter layer 130 and pixel part 100a (or the cathode electrode) maintains. Also, the area of the protecting layer 140 or 240 can be determined to the extent that the water/oxygen absorption function of the getter layer 130 is not affected.

For example, the protecting layer 140 or 240 can be disposed on the getter layer 130 so that a center area of the protecting layer 140 and 240 may correspond to a center area of the second region 122 which is deflected in the maximum magnitude when the external force is exerted on the cap 120.

Figure 5C:
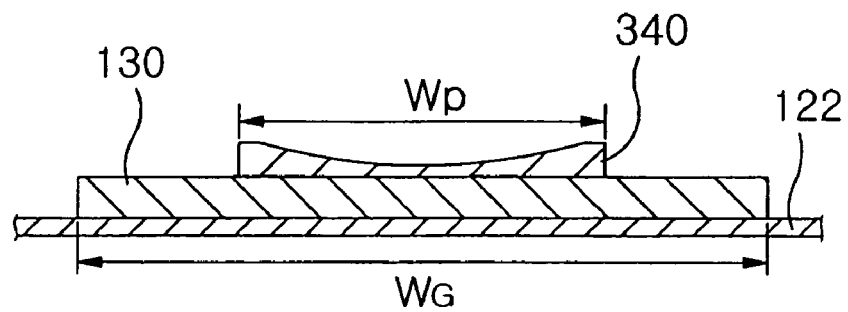

FIG. 5c is a cross-sectional view of an organic light-emitting device according to a third embodiment of the present invention, corresponding to FIG. 5a.

As shown in FIG. 3, the deflected displacement is the largest value in the center area of the second region 122. Therefore, in case the excessive external force is exerted on the second region 122, the protecting layer corresponding to the center area of the second region 122 presses the pixel part 100a with the excessive pressure, whereby the elements of the pixel parts 100a may be damaged by the protecting layer.

In order to prevent the protecting layer 340 from excessively pressing the pixel part 100a, a thickness of the protecting layer 340 can be determined to increase in a direction from the center area of the protecting layer 340 to edges of the protecting layer 340.

In case the center area of the second region 122 of the cap 120 excessively is pressed toward the pixel part 100a, the protecting layer 340 does not contact the pixel part 100a. Therefore, the element of the pixel part 100a is not damaged by the pressed protecting layer.

Figure 5D:
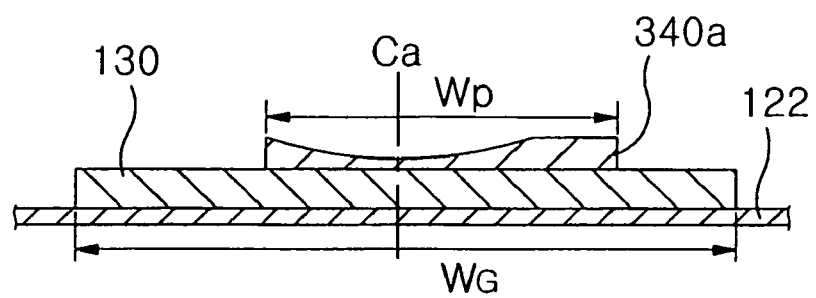

FIG. 5d is a cross-sectional view of an organic light-emitting device according to a fourth embodiment of the present invention, corresponding to FIG. 5a. A protecting layer 340a shown in FIG. 5d is attached to the getter layer 130 in the manner that a center area of the protecting layer 340a does not correspond to a center area Ca of the second region 122 of the cap 120. Also, the thickness of the protecting layer 340a can be determined to increase in a direction from the center area Ca of the second region 122 to edges of the protecting layer 340a.

Figure 6:
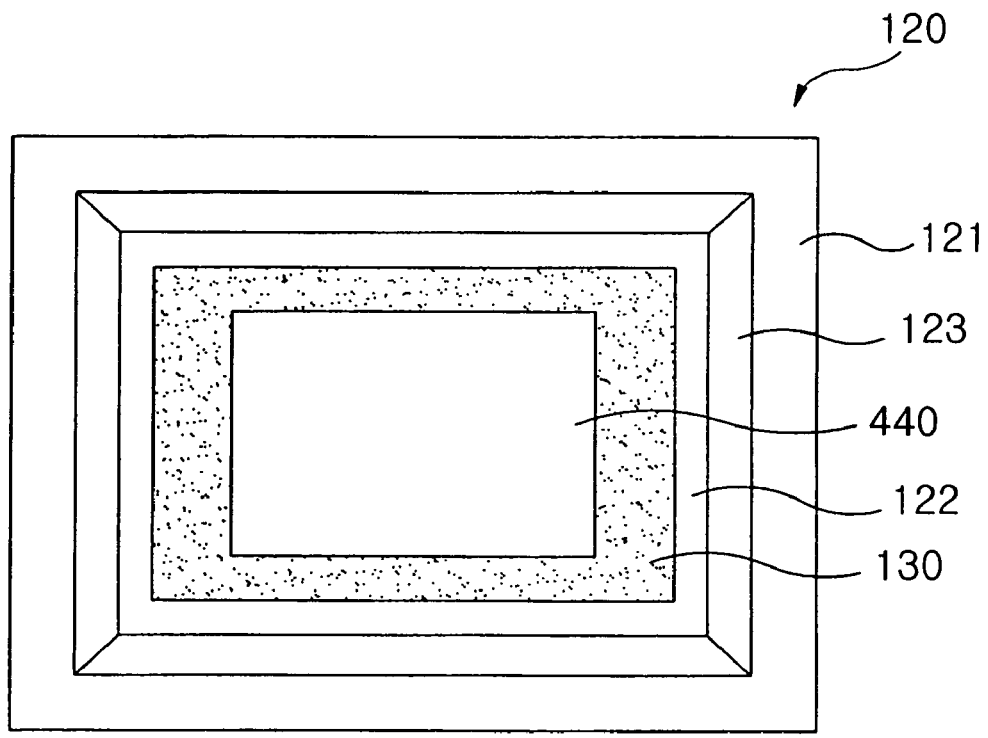
FIG. 6 is a plane view showing a bottom of a cap of an organic light-emitting device according to a fifth embodiment of the present invention

FIG. 6 is a plane view showing a bottom of a cap of an organic light-emitting device according to a fifth embodiment of the present invention, and shows that edges of a protecting layer 440 are disposed on the inside of the getter layer 130. Therefore, the whole outer area of the getter layer 130 can be exposed by the protecting layer 440.

In case the second region 122 is pressed toward the substrate 100 by the external force exerted on the cap 120, the center area of the second region 122 of the cap 120 is deflected in the maximum magnitude, and the deflected displacement L2 becomes smaller in a direction to edges of the second region 122, as shown in FIG. 3.

Therefore, only if the protecting layer 440 is disposed corresponding to the center area of the second region 122 of the cap 120, the getter layer 130 can be effectively prevented from contacting the cathode electrode of the pixel part 100a. If this requirement is met, the location of the edge of the protecting layer 440 is not limited.

A shape of the protecting layer 440 attached to the getter layer 130 can be determined considering this requirement. As shown in FIG. 6, the length and the width of the protecting layer 440 attached to the getter layer 130 are smaller than those of the getter layer 130. Therefore, the whole outer area of the getter layer 130 can be exposed, not covered by the protecting layer 440.

To minimize the area of the protecting layer 440 can prevent the water absorption function of the getter layer 130 from being deteriorated. Therefore, the water absorption function of the getter layer 130 can be maximized by minimizing the area of the protecting layer 440 to prevent the getter layer 130 from contacting the cathode electrode of the pixel part 100a.

Here, as explained above, the protecting layer 440 is disposed on the getter layer 130 in the manner that the center area of the protecting layer 440 corresponds to the center area of the second region 122 showing the maximum deflected displacement. The function of the protecting layer 440 shown in FIG. 6 is the same as that of the protecting layer 140 of the first embodiment of the present invention, and thus the explanation of the protecting layer 440 is omitted.

Although the protecting layer 140, 240, 340, 340a or 440 is explained as one continuous layer, the constitution of the protecting layer is not limited thereto. For example, a multi-layer constitution and/or multi-material constitution can be used as the protecting layer.

Hereinafter, experimental examples according to the embodiments of the present invention will be explained

EXPERIMENTAL EXAMPLE

A Cap of the organic light-emitting device having a structure shown in FIG. 4 was made for the experiment, and the detailed experimental condition is described in Table 1.

TABLE 1

| | Size of Metal Cap | Size of Getter Layer | Size of Protecting Layer | Thickness of Cap:Thickness of Protecting Layer |
|---|---|---|---|---|
| Comparative Example | 44 mm × 32.75 mm | 9 mm × 17 mm | none | 10 μm:— |
| Experimental Example 1 | 44 mm × 32.75 mm | 9 mm × 17 mm | 4.5 mm × 17 mm | 10 μm:1.0 μm |

TABLE 1-continued

| | Size of Metal Cap | Size of Getter Layer | Size of Protecting Layer | Thickness of Cap:Thickness of Protecting Layer |
|---|---|---|---|---|
| Experimental Example 2 | 44 mm × 32.75 mm | 8 mm × 14 mm | 4.0 mm × 17 mm | 10 μm:1.0 μm |

Table 1, twenty samples for the comparative example, twenty-four samples for the experimental example 1, and twenty four samples for experimental example 2 were selected, and then the forces of 5 kg, 10 kg, 15 kg and 20 kg were exerted on the samples After the force exerted on the cap was removed, the experiment for "Line Defect" was performed, and the experimental results are described in Table 2.

"Line Defect" described in Table 2 means that a metal electrode (a cathode electrode) was damaged or separated from a substrate by the getter layer and the metal electrode contacted to each other, and that a pixel corresponding to the damaged metal electrode did not emit normally in the light-emitting experiment.

As described in Table 2, all of twelve samples made for the experimental examples 1 and 2 were evaluated as not being in "Line Defect" status for the force 10 kg and 15 kg respectively, and particularly even for the force 20 kg, the rate of "Line Defect" was very low (about 16%), i.e., two samples were in "Line Defect" status among twelve samples.

This result means that the damage or separation of the metal electrode was decreased in the samples made for the experimental examples 1 and 2 because the protecting layer prevented the getter layer from contacting the metal electrode.

TABLE 2

| | | Force (unit: kg) | | | |
|---|---|---|---|---|---|
| | | 5 | 10 | 15 | 20 |
| Comparative Example | 1 | x | Line Defect | Line Defect | * |
| | 2 | x | Line Defect | Line Defect | * |
| | 3 | x | Line Defect | * | * |
| | 4 | x | x | * | * |
| | 5 | x | x | * | * |
| Experimental Example 1 | 1 | x | x | x | Line Defect |
| | 2 | x | x | x | x |
| | 3 | x | x | x | x |
| | 4 | x | x | x | x |
| | 5 | x | x | x | x |
| | 6 | x | x | x | x |
| Experimental Example 2 | 1 | x | x | x | x |
| | 2 | x | x | x | Line Defect |
| | 3 | x | x | x | x |
| | 4 | x | x | x | x |
| | 5 | x | x | x | x |
| | 6 | x | x | x | x |

*: Samples #1 and #2 for the comparative example were evaluated as being in "Line Defect" status for the force 15 kg, and thus the experiments of the remaining samples were omitted for the force 15 kg and 20 kg.
x: "x" means that the sample emitted normally without "Line Defect."

Figure 8A:
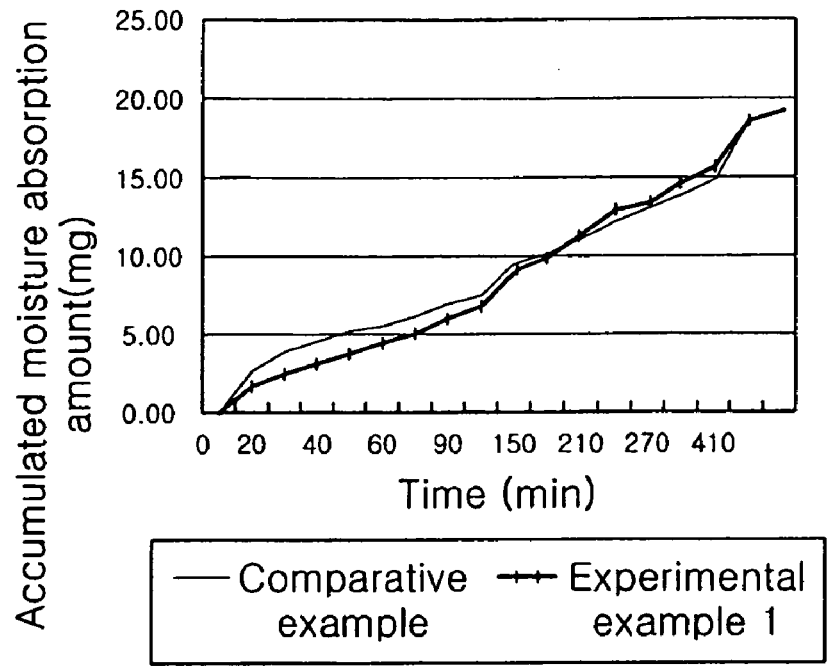
Figure 8B:
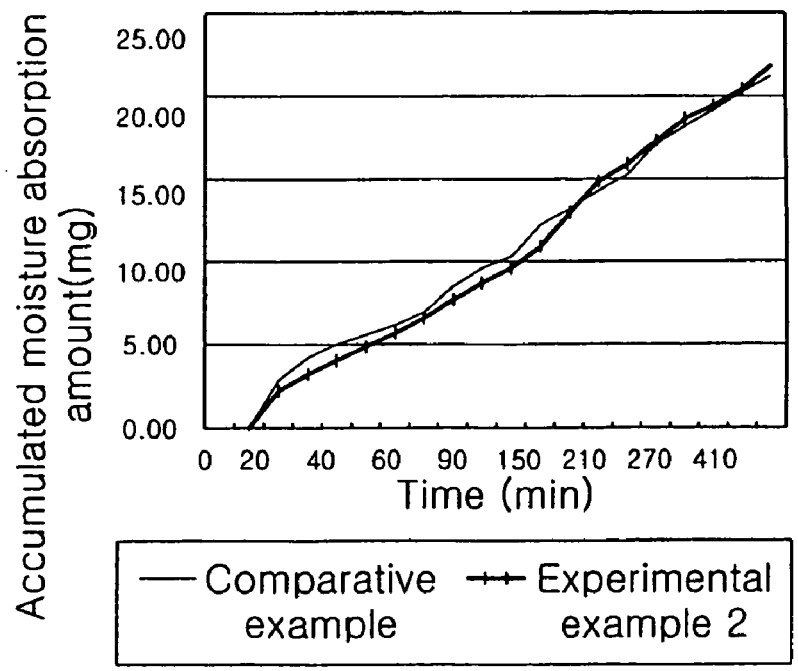
Figure 9:
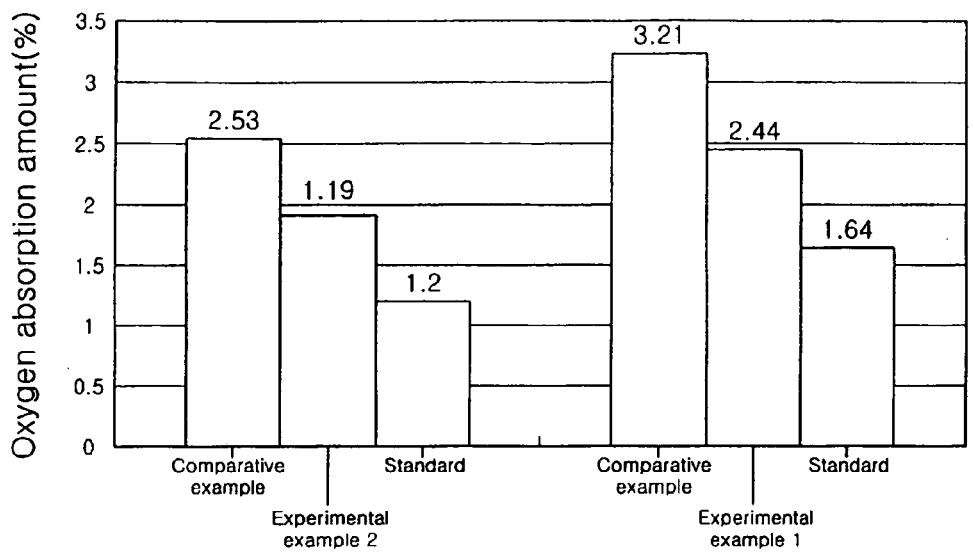

FIGS. 7 to 9 are graphs showing the results of the moisture absorption experiment and the oxygen absorption experiment for the comparative example, the experimental example 1 and the experimental example 2.

Figure 7A:
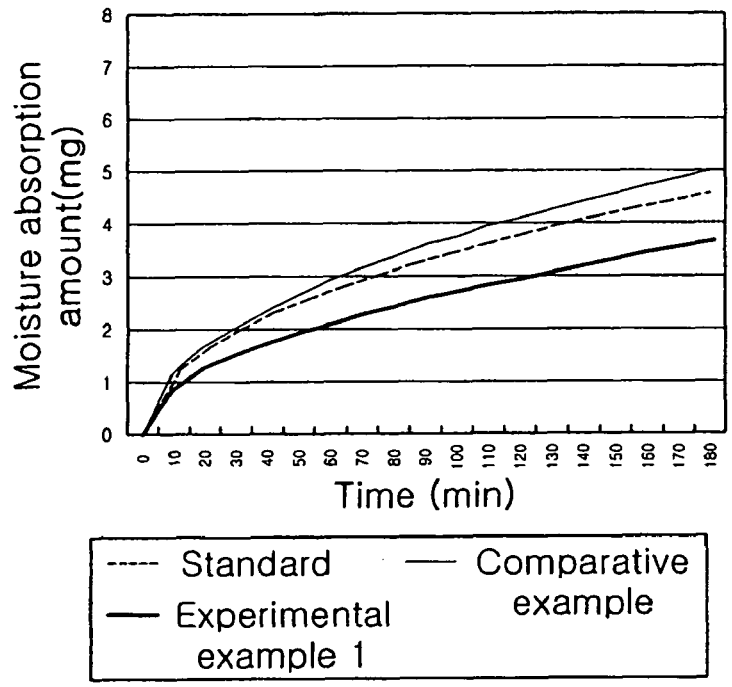
FIGS. 7 to 9 are graphs showing moisture absorption test results and oxygen absorption test results for a comparative example, experimental examples 1 and 2.

FIG. 7a is a graph showing the average moisture absorption velocities of six samples for the experimental example 1 and the average moisture absorption velocities of five samples for the comparative example under the temperature of 20° C. and the moisture condition of 60%. A dotted line means the standard moisture absorption velocity for a standard sample.

Figure 7B:
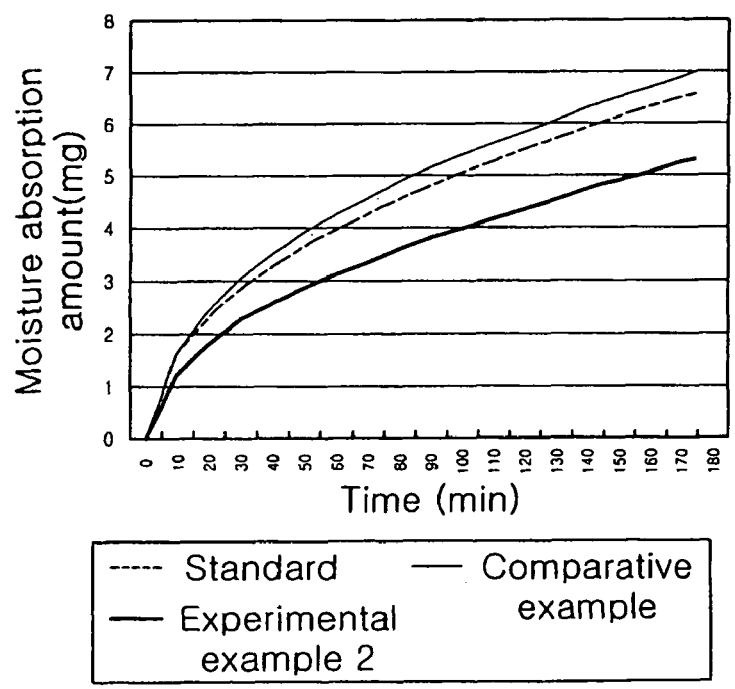

FIG. 7b is a graph showing the average moisture absorption velocities of six samples for the experimental example 2 and the average moisture absorption velocities of five samples for the comparative example under the temperature of 25° C. and the moisture condition of 60%. A dotted line means a standard moisture absorption velocity for a standard sample.

In FIGS. 7a and 7b, the moisture absorption velocities of the samples for the experimental examples 1 and 2 were lower than those of the samples for the comparative example.

FIG. 8a is a graph showing the accumulated moisture absorption amount of six samples for the experimental example 1 and the accumulated moisture absorption amount of five samples for the comparative example under the severe condition, the temperature of 32° C. and the moisture condition of 83%, and shows the change of the accumulated moisture absorption amount in time domain.

FIG. 8b is a graph showing the accumulated moisture absorption amount of six samples for the experimental example 2 and the accumulated moisture absorption amount of five samples for the comparative example under the temperature of 32° C. and the moisture condition of 83%.

As shown in FIGS. 8a and 8b, compared with the samples for the comparative example, the accumulated moisture absorption amounts of the samples for the experimental examples 1 and 2 were lower than those of the samples for the comparative example in the beginning. However, after about 450 minutes, there was no big difference between the samples for the comparative example and the experimental examples 1 and 2. This means that although the protecting layer was attached to the getter layer, the getter layer normally performed the moisture absorption function.

Left graphs of FIG. 9 which shows the oxygen absorption function for the getter layers, to which the protecting layers were attached, included in five samples for the experimental example 2 and the getter layers to which the protecting layers were not attached, included in five samples for the comparative example, show the average oxygen absorption amount measured after disposing in a vial under the temperature of 80° C. and the oxygen atmosphere of about 4% for 24 hours. Here, the standard value of 1.2 means the standard oxygen absorption amount that the getter layer of 8 mm×14 mm should normally absorb.

In FIG. 9, right graphs show the average oxygen absorption amount for getter layers, to which the protecting layers were attached, included in five samples for the experimental example 1 and the getter layers to which the protecting layers were not attached, included in five samples according to the comparative example, the average oxygen absorption amount being measured after disposing in a vial under the temperature of 80° C. and the oxygen atmosphere of about 4% for 24 hours. Here, the standard value of 1.64 means the standard oxygen absorption amount that the getter layer of 9 mm×17 mm should normally absorb.

There was some difference between the standard oxygen absorption amount and the oxygen absorption amount for the comparative example in the left graphs and the right graphs of FIG. 9.

As shown in FIG. 9, the oxygen absorption amounts of the samples for the experimental examples 1 and 2 were in the range between 0.6% (the experimental example 2) to 0.7% (the experimental example 1), which were lower than that of the samples for the comparative example, but were much higher than the standard oxygen absorption amount. This means that although the protecting layer was attached to the getter layer, the getter layer normally performed the moisture absorption function.

The sizes (the thickness ratio and the width ratio) of the protecting layer attached to the getter layer, used in the experiment are described in Table 3.

TABLE 3

| Sample no. | Thickness percentage of the protecting layer over the getter layer (%) | Width percentage of the protecting layer over the getter layer (%) |
| --- | --- | --- |
| 1 | No protecting layer | No protecting layer |
| 2 | 10 | 100 |
| 3 | 10 | 50 |
| 4 | 15 | 100 |
| 5 | 15 | 50 |
| 6 | 20 | 100 |
| 7 | 20 | 50 |
| 8 | 30 | 100 |
| 9 | 30 | 50 |
| 10 | 50 | 100 |
| 11 | 50 | 50 |

Sample 1 was the getter layer to which the protecting layer is not attached. "Standard sample" in FIG. 10 was the getter layer having am optimal moisture absorption amount. Here, if the moisture absorption amount of the samples was about 80% of that of the standard sample, such a sample was regarded as being normal.

TABLE 4

| Time (min) | Standard | sample 1 | sample 2 | sample 3 | sample 4 | sample 5 | sample 6 | sample 7 | sample 8 | sample 9 | sample 10 | sample 11 |
| --- | --- | --- | --- | --- | --- | --- | --- | --- | --- | --- | --- | --- |
| 0 | 0 | 0 | 0 | 0 | 0 | 0 | 0 | 0 | 0 | 0 | 0 | 0 |
| 10 | 1.16329 | 1.23 | 0.48612 | 0.88385 | 0.47154 | 0.85734 | 0.34028 | 0.6187 | 0.27709 | 0.5038 | 0.14584 | 0.26516 |
| 20 | 1.61129 | 1.7 | 0.69907 | 1.27103 | 0.67809 | 1.2329 | 0.48935 | 0.88972 | 0.39847 | 0.72449 | 0.20972 | 0.38131 |
| 30 | 1.94956 | 2.02588 | 0.83804 | 1.52371 | 0.8129 | 1.478 | 0.58663 | 1.0666 | 0.47768 | 0.86851 | 0.25141 | 0.45711 |
| 40 | 2.23181 | 2.32404 | 0.94788 | 1.72341 | 0.91944 | 1.67171 | 0.66351 | 1.20639 | 0.54029 | 0.98234 | 0.28436 | 0.51702 |
| 50 | 2.47859 | 2.63038 | 1.04875 | 1.90681 | 1.01728 | 1.8496 | 0.73412 | 1.33477 | 0.59778 | 1.08688 | 0.31462 | 0.57204 |
| 60 | 2.70035 | 2.9122 | 1.13841 | 2.06983 | 1.10425 | 2.00774 | 0.79688 | 1.44888 | 0.64889 | 1.1798 | 0.34152 | 0.62095 |
| 70 | 2.90325 | 3.13276 | 1.23479 | 2.24508 | 1.19775 | 2.17773 | 0.86435 | 1.57155 | 0.70383 | 1.27969 | 0.37044 | 0.67352 |
| 80 | 3.0913 | 3.34107 | 1.31325 | 2.38772 | 1.27385 | 2.31609 | 0.91927 | 1.6714 | 0.74855 | 1.361 | 0.39397 | 0.71632 |
| 90 | 3.26725 | 3.56979 | 1.40067 | 2.54667 | 1.35865 | 2.47027 | 0.98047 | 1.78267 | 0.79838 | 1.4516 | 0.4202 | 0.764 |
| 100 | 3.43312 | 3.71683 | 1.46791 | 2.66893 | 1.42388 | 2.58886 | 1.02754 | 1.86825 | 0.83671 | 1.52129 | 0.44037 | 0.80068 |
| 110 | 3.59041 | 3.9088 | 1.5374 | 2.79527 | 1.49128 | 2.71141 | 1.07618 | 1.95669 | 0.87632 | 1.59331 | 0.46122 | 0.83858 |
| 120 | 3.74028 | 4.05176 | 1.59568 | 2.90124 | 1.54781 | 2.8142 | 1.11698 | 2.03087 | 0.90954 | 1.6537 | 0.4787 | 0.87037 |
| 130 | 3.88367 | 4.21514 | 1.66517 | 3.02758 | 1.61521 | 2.93675 | 1.16562 | 2.1193 | 0.94915 | 1.72572 | 0.49955 | 0.90827 |
| 140 | 4.02132 | 4.37443 | 1.73241 | 3.14984 | 1.68044 | 3.05535 | 1.21269 | 2.20489 | 0.98748 | 1.79541 | 0.51972 | 0.94495 |
| 150 | 4.15386 | 4.52147 | 1.79966 | 3.27211 | 1.74567 | 3.17395 | 1.25976 | 2.29048 | 1.02581 | 1.8651 | 0.5399 | 0.98163 |
| 160 | 4.28179 | 4.68893 | 1.86691 | 3.39437 | 1.8109 | 3.29254 | 1.30683 | 2.37606 | 1.06414 | 1.93479 | 0.56007 | 1.01831 |
| 170 | 4.40555 | 4.79921 | 1.92294 | 3.49626 | 1.86526 | 3.39137 | 1.34606 | 2.44738 | 1.09608 | 1.99287 | 0.57688 | 1.04888 |
| 180 | 4.5255 | 4.9585 | 1.9745 | 3.59 | 1.91526 | 3.4823 | 1.38215 | 2.513 | 1.12546 | 2.0463 | 0.59235 | 1.077 |

FIGS. 7, 8 and 9 show that although the getter layer was attached to the protecting layer, the basic moisture/oxygen absorption function of the getter layer was not highly affected from the protecting layer.

Hereinafter, the relation between the width and the length of the getter layer and the protecting layer through the samples for the experimental example 2 will be explained.

In the samples for the experimental example 2 explained in Table 1, the size of the metal cap was 44 mm×32.75 mm, and the size of the getter layer was 8 mm(width)×14 mm(length)× 0.3 mm(thickness)

Figure 10:
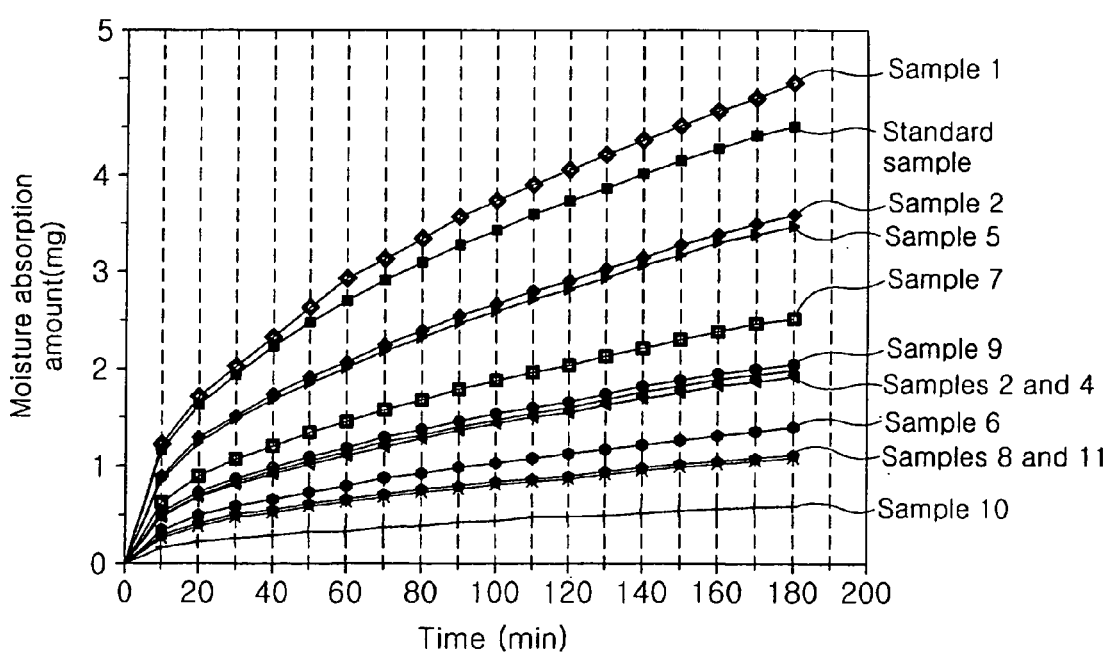
FIGS. 10 and 11 are graphs of time vs. change of moisture absorption amount.

The moisture absorption experiment for eleven getter layers including the getter layer to which the protecting layer is not attached, and the getter layers to which ten protecting layers having different thicknesses and widths were attached respectively, was performed. FIG. 10 shows the change of the moisture absorption amount in time domain.

Table 4 is a table corresponding to the graph of FIG. 10, and as shown in FIG. 10 and Table 5, the samples 3 and 5 were the samples having the moisture absorption amount nearest to that of "standard sample" which has the optimal moisture absorption amount. The moisture absorption amounts of the samples were in the range between 3.48 to 3.59 mg, i.e., 80% of the moisture absorption amount (about 4.5 mg) of the standard sample after the moisture absorption experiment of 180 minutes.

The thickness percentages of the protecting layer over the moisture absorption, of the samples 3 and 5 were in the range between 10% and 15%, respectively.

From the result shown in FIG. 10 and Table 4, the most preferable thickness percentage of the protecting layer over the getter layer was in the range between 10% to 15% (that is, the thickness ratio of the protecting layer over the getter layer is in the range between 10:1 to 7:1).

Although the thicknesses of the samples 2 and 4, the thicknesses being in the range between 10% and 15% of the thickness of the getter layer were the same as those of samples 3 and 5, their moisture absorption amounts were much lower than those of the samples 3 and 5.

Figure 11:
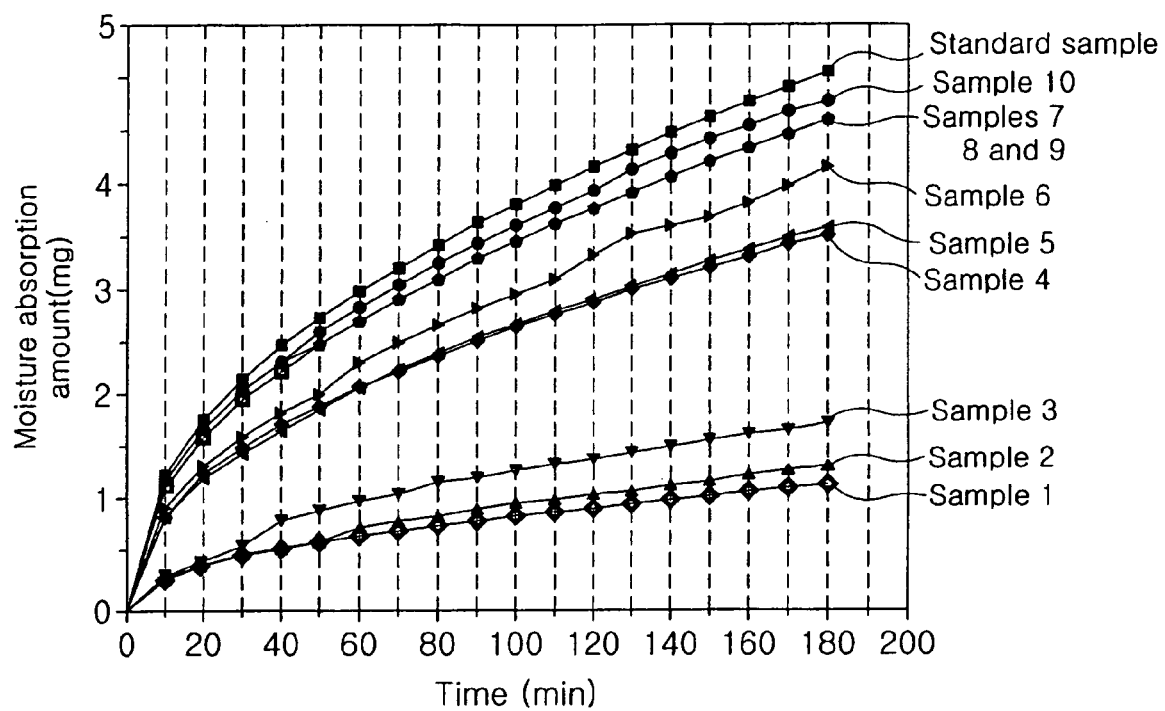

These results show that the moisture absorption amount of the getter layer changed according to the width ratio of the protecting layer over the getter layer, which will be explained in FIG. 11 and Table 5.

which the protecting layer is not attached, it was labeled as "standard sample" in FIG. 11. Here, if the moisture absorption amounts of the samples were about 80% of that of the standard sample, such a sample is regarded as being normal.

Table 5 is a table corresponding to the graph of FIG. 11, and as shown in FIG. 11 and Table 5, the samples 6, 7, 8, 9 and 10 were the samples having the moisture absorption amount

TABLE 5

| Time (min) | Standard | sample 1 | sample 2 | sample 3 | sample 4 | sample 5 | sample 6 | sample 7 | sample 8 | sample 9 | sample 10 |
|---|---|---|---|---|---|---|---|---|---|---|---|
| 0 | 0 | 0 | 0 | 0 | 0 | 0 | 0 | 0 | 0 | 0 | 0 |
| 10 | 1.16329 | 0.2572 | 0.2572 | 0.3 | 0.8143 | 0.7995 | 0.85734 | 1.0586 | 1.0586 | 1.10513 | 1.10513 |
| 20 | 1.61129 | 0.36987 | 0.36987 | 0.39 | 1.1279 | 1.105 | 1.2329 | 1.46627 | 1.46627 | 1.53072 | 1.53072 |
| 30 | 1.94956 | 0.4434 | 0.4434 | 0.55 | 1.36469 | 1.3168 | 1.478 | 1.7741 | 1.7741 | 1.85208 | 1.85208 |
| 40 | 2.23181 | 0.50151 | 0.50151 | 0.75227 | 1.56227 | 1.5106 | 1.67171 | 2.03095 | 2.03095 | 2.12022 | 2.12022 |
| 50 | 2.47859 | 0.55488 | 0.55488 | 0.83232 | 1.73501 | 1.7097 | 1.8496 | 2.25552 | 2.25552 | 2.25552 | 2.35466 |
| 60 | 2.70035 | 0.60232 | 0.69267 | 0.92 | 1.89024 | 1.8929 | 2.10774 | 2.45732 | 2.45732 | 2.45732 | 2.56533 |
| 70 | 2.90325 | 0.65332 | 0.75132 | 0.98 | 2.03228 | 2.0363 | 2.27773 | 2.64196 | 2.64196 | 2.64196 | 2.75809 |
| 80 | 3.0913 | 0.69483 | 0.79905 | 1.07 | 2.16391 | 2.1717 | 2.41609 | 2.81308 | 2.81308 | 2.81308 | 2.93674 |
| 90 | 3.26725 | 0.74108 | 0.85224 | 1.11162 | 2.28708 | 2.3204 | 2.57027 | 2.9732 | 2.9732 | 2.9732 | 3.10389 |
| 100 | 3.43312 | 0.77666 | 0.89316 | 1.16499 | 2.40318 | 2.4159 | 2.68886 | 3.12414 | 3.12414 | 3.12414 | 3.26146 |
| 110 | 3.59041 | 0.81342 | 0.93544 | 1.22014 | 2.51328 | 2.5407 | 2.81141 | 3.26727 | 3.26727 | 3.26727 | 3.41089 |
| 120 | 3.74028 | 0.84426 | 0.9709 | 1.27 | 2.6182 | 2.6336 | 3.0142 | 3.40365 | 3.40365 | 3.40365 | 3.55327 |
| 130 | 3.88367 | 0.88103 | 1.01318 | 1.32154 | 2.71857 | 2.7398 | 3.19675 | 3.53414 | 3.53414 | 3.53414 | 3.68949 |
| 140 | 4.02132 | 0.9166 | 1.0541 | 1.365 | 2.81493 | 2.8434 | 3.25535 | 3.65941 | 3.65941 | 3.65941 | 3.82026 |
| 150 | 4.15386 | 0.95218 | 1.09501 | 1.44 | 2.9077 | 2.939 | 3.32395 | 3.78001 | 3.78001 | 3.78001 | 3.94617 |
| 160 | 4.28179 | 0.98776 | 1.13593 | 1.48164 | 2.99725 | 3.0478 | 3.45254 | 3.89643 | 3.89643 | 3.89643 | 4.0677 |
| 170 | 4.40555 | 1.01741 | 1.17002 | 1.52612 | 3.08388 | 3.1195 | 3.55614 | 4.00905 | 4.00905 | 4.00905 | 4.18527 |
| 180 | 4.5255 | 1.04469 | 1.20139 | 1.56703 | 3.16785 | 3.223 | 3.7523 | 4.11821 | 4.11821 | 4.11821 | 4.29923 |

From the result of FIG. 10, in case the thickness percentage of the protecting layer over the getter layer is in the range between 10% and 15%, it was an optimal status of the getter layer. The moisture absorption experiment was performed according to the change of the width percentage of the protecting layer over the getter layer, based on the thickness percentage of 15% among the optimal percentages. In FIG. 11, the result of this test is shown.

The moisture absorption experiment was performed using eleven samples including the getter layer with the size of 8 mm(width)×14 mm(length)×0.3 mm(thickness), to which the protecting layer is not attached, and the ten getter layers to which the protecting layers with the same thickness and the different width were attached. FIG. 11 shows the change of the moisture absorption amounts of the samples in time domain.

The sizes (thickness and width) of the protecting layers attached to the getter layers, used in this experiment are described in Table 6.

TABLE 6

| Sample no. | Thickness percentage of the protecting layer over the getter layer (%) | Width percentage of the protecting layer over the getter layer (%) |
|---|---|---|
| Standard sample | No protecting layer | No protecting layer |
| 1 | 15 | 100 |
| 2 | 15 | 90 |
| 3 | 15 | 80 |
| 4 | 15 | 70 |
| 5 | 15 | 60 |
| 6 | 15 | 50 |
| 7 | 15 | 40 |
| 8 | 15 | 30 |
| 9 | 15 | 20 |
| 10 | 15 | 10 |

The standard sample 1 of this experiment was the getter layer having an optimal moisture absorption amount, to nearest to that of "standard sample" which has an optimal moisture absorption amount. The moisture absorption amounts of the samples were in the range between 3.7523 and 4.29923 mg, i.e. 80% of the moisture absorption amount (about 4.5 mg) of the standard sample after the moisture absorption experiment of 180 minutes.

The width percentages of the protecting layer over the moisture absorption, of the samples 6, 7, 8, 9 and 10 were 50%, 40%, 30%, 20% and 10%, respectively. From the result of this experiment, the most preferable width percentage of the protecting layer over the getter layer was in the range between 10% and 50% (that is, the width ratio of the protecting layer over the getter layer was in the range between 2:1 and 10:1).

In case the cap is exerted on by the external force, or deflected by its weight, the protecting layer attached to the getter layer, of the present invention prevents the getter layer from directly contacting the metal electrode, which can result in the stable performance of the display device.

An embodiment of the present invention may be achieved in a whole or in part by a display device comprising: A substrate; A pixel part disposed on the substrate; A cap comprising a first region attached on the substrate; and a second region having a position different from a position of the first region, connected with the first region, and corresponding to the pixel part; A getter layer disposed on the second region of the cap; and A protecting layer disposed on the getter layer.

Any reference in this specification to "an embodiment," "another embodiment," "the first embodiment," "the second embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A display device, comprising:
  a substrate;
  a pixel part disposed on the substrate;
  a cap comprising:
    a first region attached on the substrate; and
    a second region having a position different from a position of the first region, connected with the first region, and corresponding to the pixel part;
  a getter layer disposed on and directly contacting the second region of the cap; and
  a protecting layer disposed on a central portion of the getter layer corresponding to the pixel part, such that the getter layer is disposed between the cap and the protecting layer to prevent the central portion of the getter layer from contacting the pixel part,
  wherein a size of the protecting layer is smaller than a size of the getter layer, such that some portion of the getter layer is exposed from the protecting layer to a space encapsulated by the cap.

2. The display device according to claim 1, wherein the protecting layer is made from an insulating material.

3. The display device according to claim 2, wherein the insulating material is an epoxy base material or polyimide base material.

4. The display device according to claim 3, wherein the epoxy base material includes at least one of 1,4-BDGEDA (butanediol diglycidyl ether diacrylate), polybutadien, polybutadien acrylate, PEGDA (polyethylene glycol diacrylate), and a mixture of TMPTA (trimethylolpropane triacrylate) with epoxy acrylate.

5. The display device according to claim 1, wherein a length of the protecting layer is shorter than a length of the getter layer.

6. The display device according to claim 1, wherein a width of the protecting layer is shorter than a width of the getter layer.

7. The display device according to claim 6, wherein edges of the protecting layer are disposed within an area of the getter layer.

8. The display device according to claim 1, wherein a width ratio of the getter layer and the protecting layer is between 10:1 and 2:1.

9. The display device according to claim 1, wherein a thickness ratio of the getter layer and the protecting layer is between 10:1 and 7:1.

10. The display device according to claim 1, wherein a thickness of a part of the protecting layer is different from a thickness of a remaining part of the protecting layer.

11. The display device according to claim 10, wherein a thickness of the protecting layer increases in a direction from an area corresponding to a center area of the second region to edges of the protecting layer.

12. The display device according to claim 10, wherein a thickness of the protecting layer increases in a direction from a center area of the protecting layer to edges of the protecting layer.

13. The display device according to claim 1, wherein the second region is a plane region.

14. The display device according to claim 1, wherein the second region comprises a plurality of plane regions having different positions.

15. The display device according to claim 1, wherein the protecting layer has at least one aperture on a surface of the protecting layer.

16. The display device according to claim 1, wherein the protecting layer is a continuous layer.

17. The display device according to claim 1, wherein the pixel part comprises an organic light-emitting layer.

* * * * *